US012396093B2

(12) United States Patent
Liao et al.

(10) Patent No.: US 12,396,093 B2
(45) Date of Patent: Aug. 19, 2025

(54) POWER SUPPLY MODULE AND POWER DEVICE

(71) Applicant: Huawei Digital Power Technologies Co., Ltd., Shenzhen (CN)

(72) Inventors: Xiaojing Liao, Shanghai (CN); Hao Peng, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 340 days.

(21) Appl. No.: 17/874,594

(22) Filed: Jul. 27, 2022

(65) Prior Publication Data
US 2023/0036995 A1    Feb. 2, 2023

(30) Foreign Application Priority Data
Jul. 27, 2021    (CN) .......................... 202110848867.2

(51) Int. Cl.
*H05K 1/11* (2006.01)
*H05K 1/02* (2006.01)

(52) U.S. Cl.
CPC ........... *H05K 1/111* (2013.01); *H05K 1/0207* (2013.01); *H05K 1/0209* (2013.01); *H05K 2201/09381* (2013.01); *H05K 2201/10303* (2013.01); *H05K 2201/10704* (2013.01)

(58) Field of Classification Search
CPC ...................................... H05K 1/111
USPC ........................................ 174/142
See application file for complete search history.

(56) References Cited

U.S. PATENT DOCUMENTS

| 9,107,290 | B1 * | 8/2015 | Chen ..................... H05K 3/0061 |
| 9,978,731 | B1 * | 5/2018 | Kim ........................ H01L 23/66 |
| 10,580,811 | B2 * | 3/2020 | Fukuda ................. H01L 31/024 |
| 2008/0029875 | A1 * | 2/2008 | Zhuang ................... H01L 23/04 257/691 |
| 2012/0320545 | A1 * | 12/2012 | Lo Presti ............... H05K 3/325 361/752 |
| 2014/0327135 | A1 | 11/2014 | Stats |
| 2017/0005057 | A1 | 1/2017 | Hurwitz et al. |
| 2018/0151392 | A1 * | 5/2018 | Chew ..................... H01L 25/105 |
| 2019/0237373 | A1 | 8/2019 | Huang et al. |
| 2021/0273403 | A1 * | 9/2021 | Yang ................... H01S 5/02257 |

FOREIGN PATENT DOCUMENTS

| CN | 107017207 A | | 8/2017 |
| JP | 2007324418 | * | 6/2006 |
| KR | 1020200079441 A | | 7/2020 |

* cited by examiner

*Primary Examiner* — Stanley Tso
(74) *Attorney, Agent, or Firm* — Maier & Maier, PLLC

(57) ABSTRACT

A power supply module includes a main body, a first solder pad, and a plurality of metal connection pillars. The main body has a first surface and a second surface. The main body includes a package body, a package base layer, and a power chip. The package base layer, the power chip, and the first solder pad are all disposed in the package body. The power chip is connected to the package base layer. An end of the power chip away from the package base layer is connected to the first solder pad. Each metal connection pillar has a first end connected to the first solder pad and a second end extending through the main body to an outer side of the first surface of the main body.

18 Claims, 2 Drawing Sheets

POWER SUPPLY MODULE AND POWER DEVICE

CROSS-REFERENCE TO RELATED APPLICATION

This application claims priority to Chinese Patent Application No. 202110848867.2, filed on Jul. 27, 2021, which is hereby incorporated by reference in its entirety.

TECHNICAL FIELD

The embodiments relate to the field of electronic product structure technologies, a power supply module, and a power device.

BACKGROUND

In a conventional technology, to reduce a size of a power supply module, the power supply module is connected to a circuit board in a surface mounting manner. When the power supply module is welded to the circuit board in the surface mounting manner, because the power supply module is heavy, welding spots are prone to be flattened, resulting in poor welding. In addition, when the surface mounting manner is used, a conventional circuit board cannot fit the surface mounting connection manner, and consequently some circuit boards cannot be used.

Therefore, a new type of power supply module urgently needs to be produced to resolve the foregoing problem.

SUMMARY

The embodiments may provide a power supply module and a power device. The power supply module can be better welded to a circuit board, and the power supply module can further cooperate with an existing circuit board, to prevent waste of materials.

According to a first aspect, a power supply module may include a main body, a first solder pad, and a plurality of metal connection pillars. The main body has a first surface and a second surface. The main body includes a package body, a package base layer, and a power chip. The package base layer, the power chip, and the first solder pad are all disposed in the package body. The power chip is connected to the package base layer. An end of the power chip away from the package base layer is connected to the first solder pad. Each metal connection pillar has a first end connected to the first solder pad (away from the power chip) and a second end extending through the main body to an outer side of the first surface of the main body. The metal connection pillars located on the outer side of the first surface of the main body form a plurality of protruding parts.

In an implementation process, there may be two forms of circuit boards cooperating with the power supply module. One circuit board is provided with openings that fit the protruding parts. The protruding parts penetrate into the openings and are electrically connected to a routing layer on the circuit board. The protruding parts may be connected to the routing layer on the circuit board in a welded manner. The protruding parts are disposed to allow the power supply module to be better welded to the circuit board, and to ensure stability of connection between the power supply module and the circuit board. When the power supply module is welded to the circuit board through the protruding parts, a gap exists between the power supply module and the circuit board. When the power supply module is short-circuited and generates a high temperature, heat is transmitted between the power supply module and the circuit board through the metal connection pillars and thermal radiation. This can reduce heat received by the circuit board and reduce a probability of burning out the circuit board. The other circuit board is provided with through holes, and side walls of the through holes are covered with a routing layer. To connect the power supply module to the circuit board, pins may be connected to protruding parts, and the power supply module is connected to the circuit board with the through holes by using the pins, so that the circuit board with the through holes can also be used, to prevent waste of materials.

It should be noted that a length of a part (that is, the protruding part) that is of the metal connection pillar and that extends to the outer side of the first surface of the main body may be determined based on usage. This is not limited herein. In addition, each protruding part of the plurality of protruding parts has an identical length, so that each protruding part can fit the routing layer on the circuit board. An outline of the metal connection pillar may be a polygon or a circle.

In a possible embodiment, to ensure a heat dissipation capability of the power supply module and enable the power supply module to work continuously and stably, the power supply module may further include a second solder pad and a heat sink. The second solder pad is disposed on a surface of the second surface of the main body. The heat sink is connected to a side of the second solder pad away from the second surface. The heat sink and the second solder pad may be connected together in a welded manner.

In the foregoing embodiment, the plurality of protruding parts may be distributed on the first surface of the main body in a plurality of forms. For example, the plurality of protruding parts may be distributed on the first surface of the main body in an array, or the plurality of protruding parts may be distributed on the first surface of the main body in a circle. There may be a plurality of forms in which the protruding parts are distributed on the first surface of the main body. Details are not described herein.

To improve a heat dissipation effect of a package structure, the package base layer herein may include a thermally conductive substrate, and a first heat dissipation layer and a second heat dissipation layer that are disposed on two sides of the thermally conductive substrate. The first heat dissipation layer and the second heat dissipation layer may be made of materials such as copper, aluminum, and nickel that have good thermal conductivity. The second heat dissipation layer is disposed in a form of exposing the package body, to achieve a better heat dissipation effect.

In a possible embodiment, the package base layer needs to be routed to a surface of the package body. To maintain a thickness of the first solder pad, a metal block may be welded or electroplated to the package base layer. A surface of the metal block away from the package base layer is coplanar with a surface of the power chip away from the package base layer. The metal block is also connected to the first solder pad.

According to a second aspect, the embodiments may further provide a power device. The power device includes the power supply module in any one of the foregoing solutions, and further includes a circuit board connected to the power supply module, where a function of the circuit board may be adjusted according to an actual requirement. In addition, for the power device having the foregoing power supply module, the power supply module in the power device may adapt to circuit boards of different structures.

This can reduce manufacturing costs of the power device and prevent waste of materials.

In a possible embodiment, the circuit board may include a substrate, a routing layer, and a protective layer. The routing layer and the protective layer are successively disposed on the substrate. The protective layer is provided with a plurality of openings. The plurality of openings may be configured to fit the metal connection pillars, so that the metal connection pillars can penetrate into the openings and be electrically connected to the routing layer. To make an electrical connection between the metal connection pillars and the routing layer more stable, a connection structure may be disposed between the power supply module and the circuit board. The connection structure may make positions of the power supply module and the circuit board relatively fixed, so that positions of the metal connection pillars and the routing layer are relatively fixed. This improves stability of the electrical connection between the metal connection pillars and the routing layer and reduces a probability of a short circuit of a connection part between the power supply module and the circuit board and a probability of burning out the circuit board.

There may be a plurality of forms of connection structures. For example, the connection structure may include a welding layer. The welding layer may be located in the openings. The welding layer connects and fastens the metal connection pillars to the routing layer. The welding layer further has a conductive function, so that the metal connection pillars are stably and mechanically connected to the routing layer, and the metal connection pillars are electrically connected to the routing layer. The welding layer may include solder paste. In an actual application process, the openings may be filled with the solder paste on the routing layer, and the metal connection pillars fit the openings.

The connection structure may further include a plurality of supporting parts. A first connection part and a second connection part are respectively disposed at two ends of each of the supporting parts. The first connection part may be fastened to the first surface of the main body, so that one end of the supporting part is fastened to the first surface of the main body. The second connection part may be fastened to an outer surface of the protective layer in a bonding manner. In this way, when the power supply module is connected to the circuit board, and the metal connection pillars penetrate into the openings and are electrically connected to the routing layer, the supporting parts with an end fastened to the first surface of the main body may be fastened to the protective layer, so that positions of the power supply module and the circuit board are relatively fixed, and the positions of the metal connection pillars disposed on the power supply module and the routing layer disposed on the circuit board are relatively fixed. This ensures stability of the electrical connection between the power supply module and the circuit board.

It should be noted that, when the metal connection pillar is electrically connected to the routing layer, a length of a part of the metal connection pillar located between the first surface of the main body and the protective layer of the circuit board is the same as a sum of lengths of the supporting part, the first connection part, and the second connection part (the supporting part, the first connection part, and the second connection part are disposed in parallel to the metal connection pillar). This ensures that the metal connection pillar can still be stably electrically connected to the routing layer when the supporting part, the first connection part, and the second connection part connect the power supply module to the circuit board.

When the supporting part is disposed, the supporting part may alternatively be an elastic structure, and elastic force of the supporting parts is less than gravity of the power supply module, so that when a sum of lengths of the supporting part, the first connection part, and the second connection part is greater than a length of a part of the metal connection pillar located between the first surface of the main body and the protective layer of the circuit board, an end of the metal connection part away from the first solder pad can also be electrically connected to the routing layer.

In the foregoing embodiment, to facilitate the electrical connection between the power supply module and the circuit board and improve a speed of interconnection between the power supply module and the circuit board, a size of the metal connection pillar may be set to be less than a size of the opening.

In a possible embodiment, the circuit board includes the substrate, and the routing layer and the protective layer that are disposed on the substrate. In addition, the circuit board is provided with a plurality of through holes. A side wall of each through hole is covered by the routing layer. In this case, for the electrical connection between the power supply module and the circuit board, a pin may further sleeve the metal connection pillar, the pin is configured to fit the through hole, and the pin is press-fitted to the routing layer that covers the side wall of the through hole. This ensures that the power supply module is electrically connected to the circuit board.

It should be noted that a metal connection pillar fitting sleeve is disposed at an end of the pin, so that when a structure form of the circuit board is changed, the pin can quickly fit the metal connection pillar on the power supply module, and the power supply module is electrically connected to the circuit board with the changed structure form.

BRIEF DESCRIPTION OF THE DRAWINGS

FIG. 1b is a schematic diagram of a structure of a main body in FIG. 1a;

DETAILED DESCRIPTION OF THE EMBODIMENTS

To make the objectives, solutions, and advantages clearer, the following further describes the embodiments in detail with reference to the accompanying drawings.

Currently, a high-power power supply module commonly used in the industry is generally packaged in a housing manner. Because a pin is provided in the middle of the top, the pin only needs to be welded to a substrate or inserted into a thermoplastic part of a housing, and potting is performed. A commonly used low-power intelligent power module (IPM) is packaged in a molding manner. Because a pin is provided on a side and is a built-in pin on a lead-frame (basic frame), stamping and bending forming are performed. In the foregoing two manners, because the pin needs to be used or the pin is provided on the frame, an overall size is larger. To reduce the size of the power supply module, the power supply module may be set as a surface mounted power supply module. However, when the surface mounted power supply module is connected to a circuit board, welding spots between the power supply module and the circuit board are prone to be flattened, resulting in poor contact between the power supply module and the circuit board. In addition, when a surface mounting manner is used, a conventional circuit board cannot fit the surface mounting connection manner, and consequently some circuit boards cannot be used.

Therefore, the embodiments may provide a power supply module. The power supply module can be better welded to a circuit board, and the power supply module can further cooperate with an existing circuit board, to prevent waste of materials.

The terms used in the following embodiments are merely intended to describe embodiments but are not intended to limit. As used in the embodiments, the singular forms "one", "a", "the", "the foregoing", "the", and "this" are also intended to include, for example, "one or more", unless otherwise specified in the context.

Reference to "an embodiment", "some embodiments", or the like described herein indicates that one or more embodiments include a feature, structure, or characteristic described with reference to embodiments. Therefore, statements such as "in one embodiment", "in some embodiments", "in some other embodiments", and "in still some other embodiments" that appear do not necessarily refer to a same embodiment, but mean "one or more but not all embodiments", unless otherwise specially emphasized in another manner. The terms "include", "have", and other variants thereof all mean "include but is not limited to", unless otherwise emphasized in another manner.

Figure 1A:
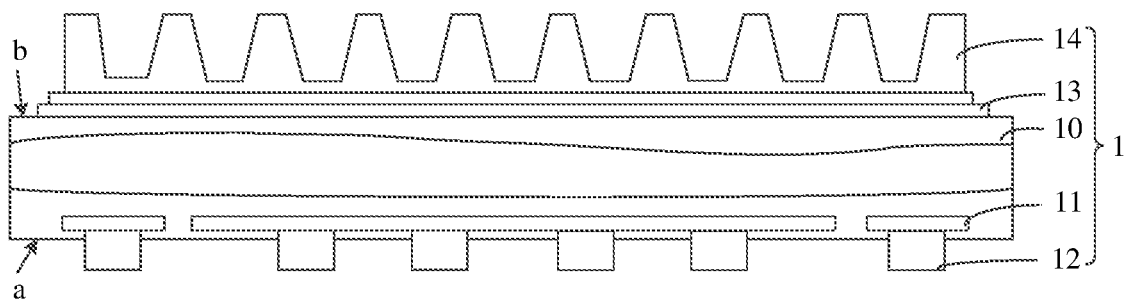
FIG. 1a is a schematic diagram of a structure of a power supply module according to an embodiment.
Figure 1B:
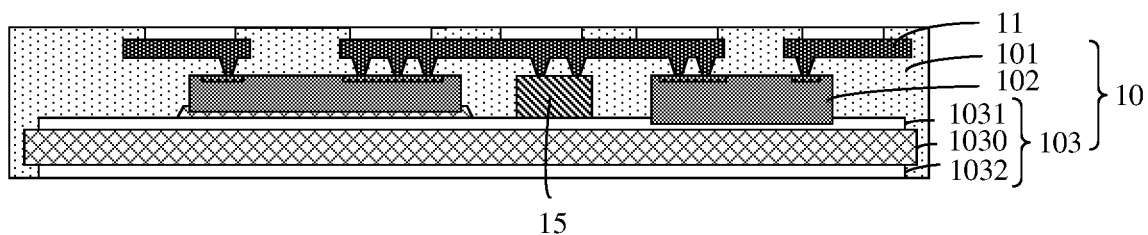

FIG. 1a is a schematic diagram of a structure of a power supply module according to an embodiment. FIG. 1b is a schematic diagram of a structure of a main body in FIG. 1a. As shown in FIG. 1a and FIG. 1b, a power supply module 1 may include a main body 10, a first solder pad 11, and a plurality of metal connection pillars 12. The main body has a first surface (a surface indicated by an arrow a in FIG. 1a) and a second surface (a surface indicated by an arrow b in FIG. 1a) that are disposed opposite to each other. The main body 10 includes a package body 101, a package base layer 103, and a power chip 102. The package base layer 103, the power chip 102, and a first solder pad 11 are all disposed in the package body 101 (that is, the first solder pad 11 is located in the main body 10). The power chip 102 is connected to the package base layer 103. An end of the power chip 102 away from the package base layer 103 is connected to the first solder pad 11. The first solder pad 11 is disposed on a side of the main body 10 facing toward the first surface. A first end of the metal connection pillar 12 is connected to the first solder pad 11 located inside the main body 10. A second end of the metal connection pillar 12 extends to an outer side of the first surface of the main body 10, so that a plurality of protruding parts may be formed on the outer side of the first surface of the main body 10. When the power supply module 1 is electrically connected to a circuit board, the circuit board may be provided with a plurality of openings that fit the protruding parts. In each pair of the opening and the protruding part that are disposed opposite to each other, the protruding part may penetrate into the opening and be connected to a routing layer on the circuit board, to implement the electrical connection between the power supply module 1 and the circuit board. In this case, the protruding part may be connected to the routing layer on the circuit board in a welded manner. The protruding part may increase a welding contact area between the protruding part and the routing layer, so that the power supply module 1 can be better welded to the circuit board. This ensures stability of the connection between the power supply module 1 and the circuit board. In addition, during the connection between the power supply module 1 and the circuit board, because the protruding part fits the opening, a gap exists between the power supply module 1 and the circuit board after the power supply module 1 is connected to the circuit board. When the power supply module 1 is short-circuited and generates a high temperature, heat is transmitted between the power supply module 1 and the circuit board through the metal connection pillars 12 and thermal radiation. This can reduce heat received by the circuit board and reduce a probability of burning out the circuit board. In addition, the circuit board may alternatively be a circuit board with through holes, and side walls of the through holes are covered by the routing layer. When the power supply module 1 is electrically connected to the circuit board, pins may be connected to the protruding parts, and the pins may fit the through holes and be electrically connected to the routing layer on the side walls of the through holes. In this way, adaptability of the power supply module 1 can be improved, and the circuit board with the through holes can be used, to prevent waste of materials.

It should be noted that, to facilitate a connection of the metal connection pillars 12 to the first solder pad 11, the main body 10 may be further provided with a plurality of holes. The holes are provided on the first surface of the main body 10, the holes extend to a position of the first solder pad 11, the holes penetrate through the first solder pad 11 and a surface of the first surface of the main body 10, and the metal connection pillars 12 penetrate through the holes and are connected to the first solder pad 11. In addition, heat generated by the power chip 102 may be dissipated from a side of the package base layer 103.

In a possible embodiment, as shown in FIG. 1a, the power supply module 1 may further include a heat sink 14 and a second solder pad 13. The second solder pad 13 may be disposed on a second surface of the main body 10. The heat sink 14 is mounted at an end of the second solder pad 13 away from the main body 10. The heat sink 14 can improve a heat dissipation capability of the power supply module 1 and ensure that the power supply module 1 can work continuously and stably. The heat sink 14 may be connected to the second solder pad 13 in a welded manner. A welding layer may be disposed between the heat sink 14 and the second solder pad 13, so that the heat sink 14 is fastened to the second solder pad 13. Alternatively, the heat sink 14 may be fastened to a side of the second solder pad 13 away from the main body 10 in another manner. Details are not described herein.

In the foregoing embodiment, the plurality of protruding parts (the parts that are of the metal connection pillars 12 and that extend to the outer side of the first surface of the main body 10) may be distributed on the first surface of the main body 10 in a plurality of forms. For example, the plurality of protruding parts are distributed on the first surface of the main body 10 in an annulus, a circle, an array, or in another form, provided that a stable electrical connection between the metal connection pillars 12 and the circuit board can be ensured. Details are not described herein.

It should be noted that a length of a part (the protruding part) that is of the metal connection pillar 12 and that extends to the outer side of the first surface of the main body 10 may alternatively be adjusted based on a situation, provided that a gap exists between the power supply module 1 and the circuit board when the metal connection pillars 12 are electrically connected to the routing layer. This is not limited herein. In addition, the parts that are of the plurality of metal connection pillars 12 and that extend to the outer side of the first surface of the main body 10 should have a same length, so that when the power supply module 1 cooperates with the circuit board, each metal connection pillar 12 can be electrically connected to the routing layer on the circuit board. This prevents poor contact between some metal connection pillars 12 and the routing layer and improves the stability of the connection between the power supply module 1 and the circuit board. In addition, the plurality of metal connection pillars 12 are disposed in parallel, and the plurality of metal connection pillars 12 may be disposed perpendicular to the main body 10. Alternatively, there is an included angle between the plurality of metal connection pillars 12 and the main body 10 and ends of the plurality of metal connection pillars 12 away from the first surface of the main body 10 are spaced from the first surface of the main body 10 at a same spacing. This can ensure that when the power supply module 1 is connected to the circuit board, the plurality of metal connection pillars 12 can all be electrically connected to the routing layer, or none of the plurality of metal connection pillars 12 can be electrically connected to the routing layer.

The outline of the metal connection pillar 12 may be a circle or a polygon, provided that the metal connection pillar 12 can protrude from the first surface of the main body 10 and can penetrate into the opening of the circuit board and be connected to the routing layer of the circuit board. This is not limited herein.

In an embodiment, the package base layer 103 may include a thermally conductive substrate 1030, and a first heat dissipation layer 1031 and a second heat dissipation layer 1032 that are disposed on two sides of the thermally conductive substrate 1030. The power chip 102 is disposed on a surface of the first heat dissipation layer 1031 away from the thermally conductive substrate 1030, and the second heat dissipation layer 1032 is exposed from the package body 101.

It should be noted that, in FIG. 1b, there is one package base layer 103, and two power chips 102 and a metal block 15 are all disposed on the first heat dissipation layer 1031 of the package base layer 103. The thermally conductive substrate 1030 is made of an insulation material with good thermal conductivity, such as ceramic or metal with high thermal conductivity. The first heat dissipation layer 1031 and the second heat dissipation layer 1032 are respectively formed on two opposite sides of the thermally conductive substrate 1030, so that heat of the power chips 102 can be dissipated from a side of the thermally conductive substrate 1030. Herein, the metal block 15 may be made of copper, aluminum, nickel, gold, or an alloy thereof.

Figure 2:
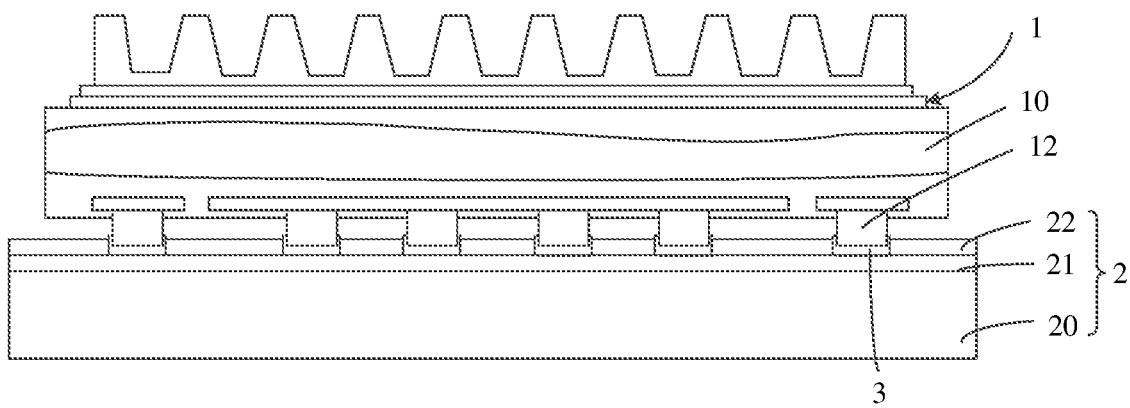
FIG. 2 is a schematic diagram of a structure of a power device according to an embodiment.

FIG. 2 is a schematic diagram of a structure of a power device according to an embodiment. As shown in FIG. 2, the power device may include the power supply module 1 in any one of the foregoing solutions, and further includes a circuit board 2 connected to the power supply module 1. A function of the circuit board 2 may be adjusted based on an actual requirement. In addition, because the power device includes the power supply module 1, the power supply module 1 may cooperate with the circuit board 2 of a different structure type, so that an original circuit board 2 can still be used and is not wasted, and manufacturing costs of the power device can be reduced.

Figure 3:
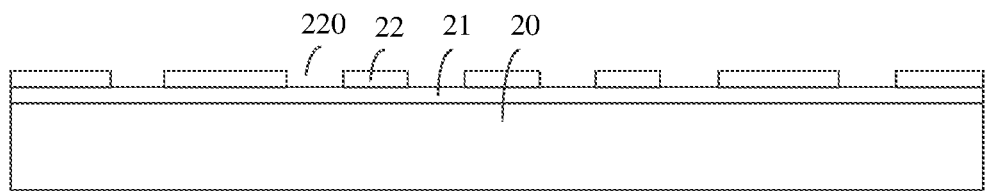
FIG. 3 is a schematic diagram of a structure of a circuit board of the power device in FIG. 2.

In an embodiment, FIG. 3 is a schematic diagram of a structure of the circuit board in FIG. 2. As shown in FIG. 2 and FIG. 3, when a power module is formed between the power supply module 1 and the circuit board 2, the circuit board 2 may have two structures. One circuit board 2 may include a substrate 20, a routing layer 21, and a protective layer 22. The routing layer 21 is disposed between the substrate 20 and the protective layer 22. The protective layer 22 is provided with a plurality of openings 220. In a thickness direction of the protective layer 22, the openings 220 may run through the protective layer 22. Therefore, when the power supply module 1 is connected to the circuit board 2, the part (the protruding part) that is of the metal connection pillar 12 and that extends to an outer portion of the main body 10 can penetrate into the opening 220 and can be electrically connected to the routing layer 21. This ensures working stability of the power device formed by connecting the power supply module 1 to the circuit board 2. In addition, the protective layer 22 includes a liquid photoimagable solder mask (commonly referred to as green oil). The liquid photoimagable solder mask may be coated on the routing layer 21. In a coating process, a plurality of uncoated areas may be reserved, and the openings 220 are provided on the plurality of uncoated areas. The protective layer 22 can reduce a probability of contamination of the routing layer 21 and can further prevent poor insulation and corrosion caused by external environment factors such as dust or moisture, to improve working stability of the circuit board 2.

Still refer to FIG. 2 and FIG. 3. To ensure stability of the electrical connection between the power supply module 1 and the circuit board 2, a connection structure may be disposed between the power supply module 1 and the circuit board 2. The connection structure can ensure that positions of the power supply module 1 and the circuit board 2 are relatively fixed. When the positions of the power supply module 1 and the circuit board 2 are relatively fixed, the metal connection pillars 12 disposed on the power supply module 1 penetrate to relatively fixed positions in the openings 220 of the protective layer 22 of the circuit board 2. If the relative positions of the power supply module 1 and the circuit board 2 are properly controlled, it can be ensured that the metal connection pillars 12 on the power supply module 1 keep in contact with the routing layer 21 of the circuit board 2. This improves the stability of the electrical connection between the power supply module 1 and the circuit board 2.

There may be a plurality of types of connection structures for connecting the circuit board 2 to the power supply module 1. For example, the connection structure may include a welding layer 3. The welding layer 3 may be disposed in the openings 220. A part that is of the metal connection pillar 12 and that penetrates into the opening 220 may be welded to the protective layer 22 and the routing layer 21 by using the welding layer 3. The welding layer 3 may electrically connect the metal connection pillars 12 to the routing layer 21. The welding layer 3 is disposed in the openings 220, and the metal connection pillars 12 penetrate into the openings 220 and are connected to the routing layer 21 by using the welding layer 3. In this case, the welding layer 3 actually functions to fasten the metal connection pillars 12 to the routing layer 21, and electrically connect the metal connection pillars 12 to the routing layer 21. This avoids a problem in a conventional technology that welding spots between the power supply module 1 and the circuit board 2 are flattened and extruded and allows the power supply module 1 to be better welded to the circuit board 2.

When the connection structure is the welding layer 3, the welding layer 3 may be made of solder paste. The openings 220 may be filled with the solder paste. The metal connection pillars 12 penetrate into the openings 220. The part that is of the metal connection pillar 12 and that penetrates into the opening 220 may be welded to the routing layer 21 by using the solder paste, to implement the connection between the power supply module 1 and the circuit board 2. In addition, because the openings 220 are filled with the solder paste, when the metal connection pillars 12 are welded to the routing layer 21 by using the solder paste, the solder paste is extruded by the metal connection pillars 12, a part of the solder paste may fit the metal connection pillars 12 in a length direction of the metal connection pillars 12, and the other part of the solder paste is located between the metal connection pillars 12 and the routing layer 21 (the other part is also located in the openings 220), to allow the metal connection pillars 12 to be better welded to the routing layer 21.

Figure 4:
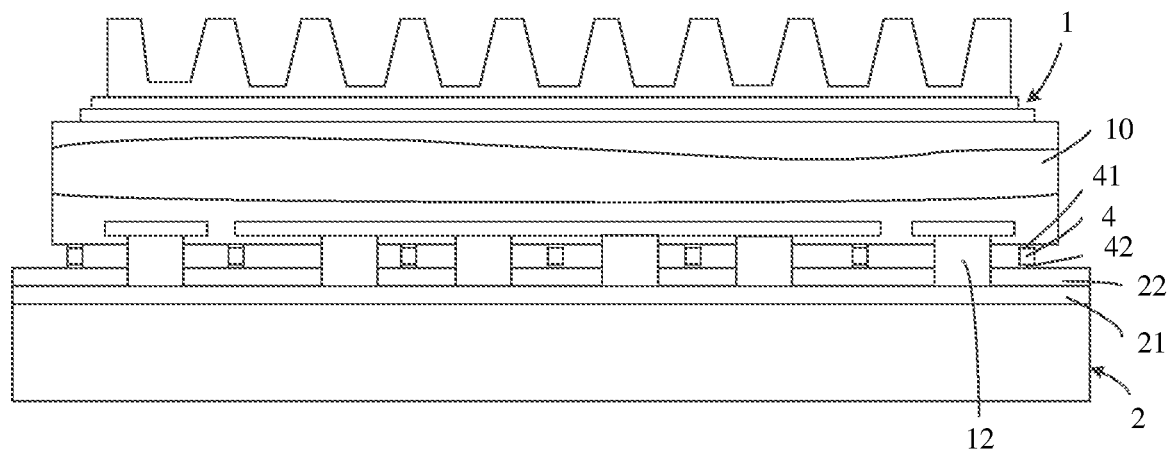
FIG. 4 is a schematic diagram of another structure of a power device according to an embodiment.

FIG. 4 is a schematic diagram of another structure of a power device according to an embodiment. A form of a connection structure in FIG. 4 is different from that in FIG. 2. As shown in FIG. 4, to ensure the stability of the electrical connection between the power supply module 1 and the circuit board 2, the connection structure disposed between the power supply module 1 and the circuit board 2 may alternatively include a plurality of supporting parts 4, first connection parts 40, and second connection parts 41. The first connection part and the second connection part are disposed at two ends of each of the supporting parts 4. The first connection part 41 is connected to the first surface of the main body 10. The second connection part 42 is connected to the protective layer 22. Therefore, positions of the power supply module 1 and the circuit board 2 are relatively fixed. In an implementation process, the supporting part 4 may be fastened to the first surface of the main body 10 by using the first connection part 40 (that is, the connection structure is fastened to the power supply module 1). The second connection part 41 may be an adhesive layer. When the metal connection pillar 12 penetrates into the opening and is electrically connected to the routing layer 21, the adhesive layer (the second connection part 41) is bonded to the protective layer 22, to make the positions of the power supply module 1 and the circuit board 2 fixed. Therefore, positions of the metal connection pillars 12 and the routing layer 21 are also relatively fixed. This maintains the electrical connection between the power supply module 1 and the circuit board 2. In this disposing manner, the stable electrical connection between the metal connection pillars 12 and the routing layer 21 may still be maintained without welding. In addition, a conductive adhesive may alternatively be disposed between the metal connection pillars 12 and the routing layer 22, so that stability of a connection between the metal connection pillars 12 and the routing layer 21 is higher.

To keep contact (an electrical connection) between the metal connection pillar 12 and the routing layer 21 when the second connection part 41 is connected to the protective layer 22, the supporting part 4 may be made of a rigid material. In this case, the supporting part 4 and the first connection part 40 and the second connection part 41 that are disposed at the two ends of the supporting part 4 may be disposed parallel to the metal connection pillar 12. In addition, a sum of lengths of the supporting part 4, the first connection part 41, and the second connection part 42 is the same as a length of a part of the metal connection pillar 12 located between the first surface of the main body 10 and the protective layer 21. Alternatively, the supporting part 4 may be made of an elastic material. In this case, the supporting part 4 may be an elastic structure. When elastic force of the supporting parts 4 is less than gravity of the power supply module 1, the supporting part 4 and the first connection part 40 and the second connection part 41 that are disposed at the two ends of the supporting part 4 may be disposed parallel to the metal connection pillar 12. In addition, a sum of lengths of the supporting part 4, the first connection part 40, and the second connection part 41 is greater than a length of a part of the metal connection pillar 12 located between the first surface of the main body 10 and the protective layer 21. When the power supply module 1 is connected to the circuit board 2, the supporting part 4 is compressed under an effect of the gravity, so that when the power supply module 1 is mechanically connected to the circuit board 2, the metal connection pillar 12 disposed on the power supply module 1 is also electrically connected to the routing layer 21 of the circuit board 2.

In the foregoing embodiment, to ensure the stability of the electrical connection between the power supply module 1 and the circuit board 2, the connection structure disposed between the power supply module 1 and the circuit board 2 may alternatively include the plurality of supporting parts 4, the first connection parts 40, and the second connection parts 41. The first connection part and the second connection part are disposed at two ends of each of the supporting parts 4. The first connection part 40 is connected to the first surface of the main body 10. The second connection part 41 is connected to the protective layer 22. Therefore, the positions of the power supply module 1 and the circuit board 2 are relatively fixed. In an implementation process, the second connection part 41 may be fastened to the protective layer 22. The first connection part 40 may be an adhesive layer. When the power supply module 1 and the circuit board 2 need to be electrically connected, and the positions of the power supply module 1 and the circuit board 2 need to be relatively fixed, the metal connection pillar 12 penetrates into the opening. When the metal connection pillar 12 comes in contact with (is electrically connected to) the routing layer 21, the first connection part 41 is bonded to the first surface of the main body 10. In this way, the positions of the power supply module 1 and the circuit board 2 are relatively fixed. This ensures the stable electrical connection between the metal connection pillar 12 and the routing layer 21 and prevents a poor connection between the power supply module 1 and the circuit board 2.

It should be noted that, when the connection structure includes the supporting part 4, and the first connection part 40 and the second connection part 41 that are disposed at the two ends of the supporting part 4, the first connection part 40 and the second connection part 41 may each be a bonding layer. When the connection structure is disposed, a first group of the supporting parts 4 may be bonded to the first surface of the main body 10 by using the first connection parts 40, and a second group of the supporting parts 4 may be bonded to the protective layer by using the second connection parts 41. In this case, the first group of the supporting parts 4 are fastened to the power supply module 1 by using the first connection parts 40, and the second group of the supporting parts 4 are fastened to the circuit board 2 by using the second connection parts 41. In addition, the first group of the supporting parts 4 disposed on the power supply module 1 and the second group of the supporting parts 4 disposed on the circuit board 2 are staggered, so that when the power supply module 1 is connected to the circuit board 2, the second connection parts 41 connected to the first group of the supporting parts 4 are bonded to the protective layer 22, and the first connection parts 40 connected to the second group of the supporting parts 4 are bonded to the first surface of the main body 10. Therefore, the positions of the power supply module 1 and the circuit board 2 are fixed. In this way, the electrical connection between the metal connection pillars 12 and the routing layer 21 is still stable, to ensure higher working stability of the power device formed by the power supply module 1 and the circuit board 2.

In the foregoing embodiment, to facilitate a connection between the metal connection pillar and the circuit board 2 and increase a speed of butt joint between the metal connection pillar and the circuit board 2, a size of the metal connection pillar may be less than a size of the opening. In addition, if the size of the metal connection pillar is less than the size of the opening, an assembly error may be tolerated between the metal connection pillar disposed on the power supply module 1 and the opening provided in the circuit board 2.

Figure 5:
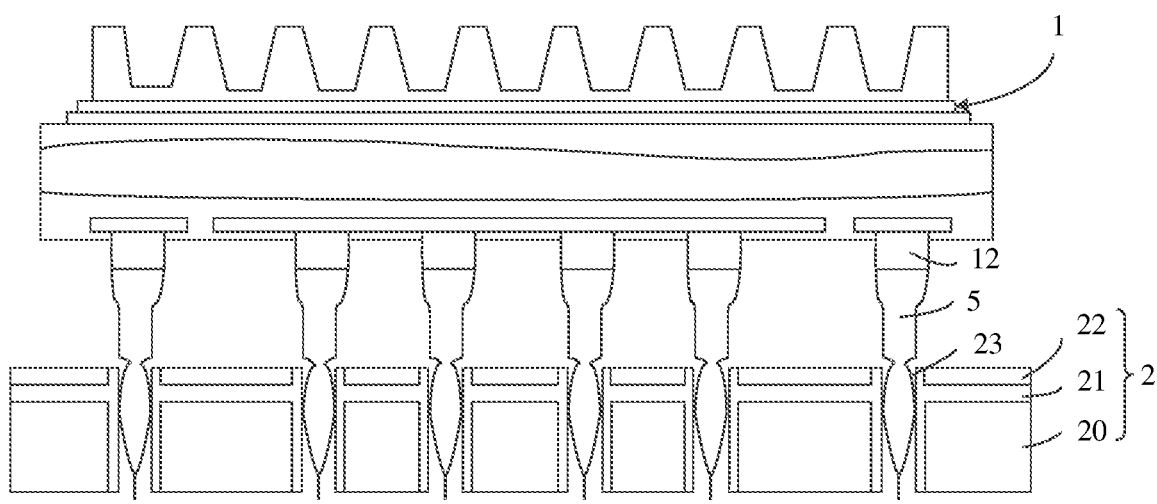
FIG. 5 is a schematic diagram of another structure of a power device according to an embodiment.

In a possible embodiment, FIG. 5 is a schematic diagram of another structure of a power device. A structural form of a circuit board in FIG. 5 is different from that in FIG. 2. When the plurality of metal connection pillars 12 are disposed on the power supply module 1, the circuit board 2 that cooperates with the power supply module 1 to form the power device may be an initial structure. The circuit board 2 includes the substrate 20, the routing layer 21, and the protective layer 22. A part of the routing layer 21 is disposed between the protective layer 22 and the substrate 20. In addition, the circuit board 2 is further provided with through holes 23 that run through the substrate 20, the routing layer 21, and the protective layer 22. Side walls of the through holes 23 are covered by the routing layer 21. In this case, to connect the power supply module 1 to the circuit board 2, the circuit board 2 in this form can also be used and is not wasted. The power device may further include pins 5. One end of the pin 5 is provided with a sleeve, and the other end of the pin 5 may be a sharp hollow-out structure. The pin 5 may sleeve the metal connection pillar 12 by using the sleeve, and the other end of the pin 5 may penetrate into the through hole 23. The pin 5 in the through hole 23 is press-fitted to the routing layer 21 that covers the side wall of the through hole 23, so that the pin 5 is electrically connected to the routing layer 21. This ensures the stable electrical connection between the power supply module 1 and the circuit board 2.

It should be noted that the metal connection pillar 12 on the power supply module 1 may alternatively be connected to the pin 5 in a welded or bonded manner. When the metal connection pillar 12 is connected to the pin 5 in the bonded manner, a bonding material is a conductive material. In addition, the metal connection pillars 12 on the power supply module 1 is disposed in a manner that the power supply module 1 can be connected to the circuit board 2 with the openings, and can also be connected to the circuit board 2 with the through holes 23 through the pins 5, so that the power supply module 1 can be applicable to two different forms of circuit boards 2. In addition, when cooperating with the two different forms of circuit boards 2, the power supply module 1 can quickly change a structure form of the power supply module 1. This improves applicability of the power supply module 1.

The foregoing descriptions are merely embodiments but are not intended as limiting. Any variation or replacement readily figured out by a person skilled in the art shall fall within to the scope of embodiments.

What is claimed is:
1. A power supply module, comprising:
a main body comprising a package body, a package base layer, and a power chip;
a first solder pad, a second solder pad; and
a plurality of metal connection pillars, wherein the package base layer, the power chip, and the first solder pad are all disposed in the package body,
the power chip is connected to the package base layer,
an end of the power chip away from the package base layer is connected to the first solder pad,
a first end of each of the metal connection pillars is connected to the first solder pad,
and a second end of the metal connection pillar extends through the main body to an outer side of a first surface of the main body, to form a plurality of protruding parts on an outer portion of the first surface of the main body;
wherein the first solder pad is connected to the second solder pad,
the second solder pad is in a second surface of the main body opposite to the first surface of the main body, and the second solder pad is exposed to exterior of the main body;
wherein the package base layer further comprises:
a thermally conductive substrate,
a first heat dissipation layer
and a second heat dissipation layer are disposed on two sides of the thermally conductive substrate,
the power chip is disposed on the first heat dissipation layer,
and the second heat dissipation layer is exposed from the package body;
a metal block,
wherein the metal block is configured to be fastened to the first heat dissipation layer and connected to the first solder pad,
and a surface of the metal block away from the package base layer is coplanar with a surface of the power chip away from the package substrate;
wherein the power device further comprises:
a connection structure having a plurality of supporting parts to maintain stability of connection with a circuit board.
2. The power supply module according to claim 1, wherein the plurality of protruding parts is distributed on the first surface of the main body in an array.
3. The power supply module according to claim 1, wherein an outline of the metal connection pillar is a polygon or a circle.
4. The power supply module according to claim 1, further comprising:
a heat sink, wherein the heat sink is disposed on a side of the second solder pad away from the main body.
5. The power supply module according to claim 1, further comprising a circuit board electrically connected to the power supply module.
6. A power device, comprising
a power supply module comprising
a main body, comprising a package body, a package base layer, and a power chip,
a first solder pad, a second solder pad, and
a plurality of metal connection pillars,
wherein, the package base layer, the power chip, and the first solder pad are all disposed in the package body,
the power chip is connected to the package base layer, and
an end of the power chip away from the package base layer is connected to the first solder pad;

and a first end of each of the metal connection pillars is connected to the first solder pad, and a second end of the metal connection pillar extends through the main body to an outer side of a first surface of the main body, to form a plurality of protruding parts on an outer portion of the first surface of the main body;

wherein the first solder pad is connected to the second solder pad, the second solder pad is in a second surface of the main body opposite to the first surface of the main body, and the second solder pad is exposed to exterior of the main body;

wherein the package base layer further comprises:

a thermally conductive substrate, a first heat dissipation layer and a second heat dissipation layer are disposed on two sides of the thermally conductive substrate, the power chip is disposed on the first heat dissipation layer, and the second heat dissipation layer is exposed from the package body; and a metal block, wherein the metal block is configured to be fastened to the first heat dissipation layer and connected to the first solder pad, and a surface of the metal block away from the package base layer is coplanar with a surface of the power chip away from the package substrate; and a circuit board electrically connected to the power supply module;

wherein the circuit board further comprises:

a substrate, and a connection structure; and wherein the connection structure further comprises:

a plurality of supporting parts, first connection parts, and second connection parts.

7. The power device according to claim 6, wherein the circuit board further comprises:

a routing layer and a protective layer are successively disposed on the substrate, the protective layer is provided with a plurality of openings that fit the plurality of metal connection pillars, and in each pair of the metal connection pillar and the corresponding opening, the metal connection pillar penetrates into the opening and is electrically connected to the routing layer; and wherein the connection structure is disposed between the power supply module and the circuit board, and the connection structure is configured to make positions of the power supply module and the circuit board relatively fixed.

8. The power device according to claim 7, wherein the connection structure further comprises a welding layer disposed in the openings that is configured to fasten the metal connection pillars to the routing layer.

9. The power device according to claim 8, wherein the welding layer comprises solder paste.

10. The power device according to claim 7, wherein the connection structure further comprises:

the first connection part and the second connection part are disposed at two ends of each supporting part of the plurality of supporting parts, the first connection part is connected to the first surface of the main body, and the second connection part is connected to the protective layer.

11. The power device according to claim 10, wherein a length of the plurality of supporting part, the first connection part, and the second connection part is the same as a length between a surface of the connection pillar that is located on a side of the main body facing toward the protective layer and a surface of a side of the protective layer away from the substrate.

12. The power device according to claim 10, wherein the supporting part is an elastic supporting pillar.

13. The power device according to claim 10, wherein the first connection part is an adhesive layer.

14. The power device according to claim 10, wherein the second connection part is an adhesive layer.

15. The power device according to claim 7, wherein a size of the metal connection pillar is less than a size of the opening.

16. The power device according to claim 7, wherein the circuit board comprises the substrate, and the routing layer and the protective layer that are disposed on the substrate, the circuit board is provided with a plurality of through holes, and side walls of the holes are covered by the routing layer; and the power device further comprises:

a plurality of pins corresponding to the plurality of through holes, wherein, for each respective pair of the pin and the corresponding through hole, a first end of the pin is connected to the metal connection pillar, and the other end of the pin penetrates into the through hole and is press-fitted into the through hole.

17. The power supply module according to claim 1, wherein the metal block is made of copper, aluminum, nickel, gold, or an alloy thereof.

18. The power supply module according to claim 1, wherein the thermally conductive substrate is made of insulation material of ceramic or metal with high thermal conductivity.

* * * * *